United States Patent
Kurokawa

(10) Patent No.: US 10,430,093 B2
(45) Date of Patent: Oct. 1, 2019

(54) SEMICONDUCTOR DEVICE, ELECTRONIC COMPONENT, AND ELECTRONIC DEVICE

(71) Applicant: Semiconductor Energy Laboratory Co., Ltd., Atsugi-shi, Kanagawa-ken (JP)

(72) Inventor: Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/482,970

(22) Filed: Apr. 10, 2017

(65) Prior Publication Data

US 2017/0300261 A1    Oct. 19, 2017

(30) Foreign Application Priority Data

Apr. 15, 2016 (JP) .................. 2016-081765

(51) Int. Cl.
*G06F 3/06* (2006.01)
*G11C 7/10* (2006.01)
(Continued)

(52) U.S. Cl.
CPC .......... *G06F 3/0625* (2013.01); *G06F 1/3287* (2013.01); *G06F 3/0634* (2013.01);
(Continued)

(58) Field of Classification Search
CPC .................................................. G06F 1/3287
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| CN | 102640207 A | 8/2012 |
| EP | 1737044 A | 12/2006 |

(Continued)

OTHER PUBLICATIONS

Terman, Lewis, "MOSFET Memory Circuits", Jul. 1971 (Year: 1971).*

(Continued)

*Primary Examiner* — Edward J Dudek, Jr.
(74) *Attorney, Agent, or Firm* — Fish & Richardson P.C.

(57) ABSTRACT

Power consumption of an interface circuit is to be reduced. A semiconductor device includes a processor and the interface circuit including a register that stores setting information. The register includes a first memory circuit capable of storing the setting information when power supply voltage is supplied, and a second memory capable of storing the setting information when supply of the power supply voltage is stopped. The interface circuit changes a state between a first state, a second state, a third state, and a fourth state. In the first state, the setting information is stored in the first memory. In the second state, the interface circuit operates on the basis of the setting information stored in the first memory circuit. In the third state, the setting information stored in the first memory circuit is stored in the second memory circuit and the supply of the power supply voltage is stopped. In the fourth state, the supply of the power supply voltage is restarted and the setting information stored in the second memory circuit is stored in the first memory circuit. The interface circuit changes a state between the second state, the (Continued)

third state and the fourth state on the basis of a state of the functional device.

3 Claims, 12 Drawing Sheets

(51) Int. Cl.
    *G06F 1/3287*     (2019.01)
    *G11C 11/4074*     (2006.01)
    *G11C 11/4093*     (2006.01)
    *G11C 11/4072*     (2006.01)

(52) U.S. Cl.
    CPC .......... *G06F 3/0673* (2013.01); *G11C 7/1087* (2013.01); *G11C 11/4074* (2013.01); *G11C 11/4093* (2013.01); *G11C 11/4072* (2013.01); *Y02D 10/171* (2018.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,741,489 B2 | 5/2004 | Takasu et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,314,637 B2 | 11/2012 | Kato et al. |
| 8,362,538 B2 | 1/2013 | Koyama et al. |
| 8,410,838 B2 | 4/2013 | Kato et al. |
| 8,432,187 B2 | 4/2013 | Kato et al. |
| 8,575,985 B2 | 11/2013 | Ohmaru et al. |
| 8,593,856 B2 | 11/2013 | Koyama et al. |
| 8,618,586 B2 | 12/2013 | Koyama et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0041761 A1 | 3/2004 | Sugita et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0077725 A1 | 3/2008 | Yabuki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0148846 A1 | 6/2011 | Arasawa et al. |
| 2011/0149185 A1 | 6/2011 | Yamazaki |
| 2012/0230078 A1 | 9/2012 | Fujita |
| 2012/0257440 A1 | 10/2012 | Takemura |
| 2012/0262982 A1 | 10/2012 | Takemura |
| 2012/0287701 A1 | 11/2012 | Takemura |
| 2013/0057315 A1 | 3/2013 | Kato et al. |
| 2013/0083588 A1 | 4/2013 | Takemura |
| 2013/0222033 A1 | 8/2013 | Kato et al. |
| 2013/0234757 A1 | 9/2013 | Kato et al. |
| 2014/0108836 A1* | 4/2014 | Nishijima ............. G06F 1/3275 713/320 |
| 2014/0204696 A1 | 7/2014 | Kato et al. |
| 2014/0293711 A1 | 10/2014 | Kato et al. |
| 2014/0337649 A1* | 11/2014 | Biswas ................. G06F 1/3218 713/323 |
| 2015/0213846 A1 | 7/2015 | Nakagawa et al. |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |

(56) References Cited

FOREIGN PATENT DOCUMENTS

| | | |
|---|---|---|
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-152506 A | 5/2003 |
| JP | 2004-070186 A | 3/2004 |
| JP | 2004-103957 A | 4/2004 |
| JP | 2004-273614 A | 9/2004 |
| JP | 2004-273732 A | 9/2004 |
| JP | 2012-257197 A | 12/2012 |
| JP | 2013-050738 A | 3/2013 |
| JP | 2016-054472 A | 4/2016 |
| KR | 2004-0014349 A | 2/2004 |
| KR | 2012-0094957 A | 8/2012 |
| KR | 2012-0103502 A | 9/2012 |
| WO | WO-2004/114391 | 12/2004 |

OTHER PUBLICATIONS

Ando.K, Nonvolatile Magnetic Memory, Fed Review, Mar. 14, 2002, vol. 1, No. 14, pp. 1-8.

International Search Report (Application No. PCT/IB2017/051931) dated Jun. 20, 2017.

Written Opinion (Application No. PCT/IB2017/051931) dated Jun. 20, 2017.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties ", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

(56) References Cited

OTHER PUBLICATIONS

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW'08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

SEMICONDUCTOR DEVICE, ELECTRONIC COMPONENT, AND ELECTRONIC DEVICE

TECHNICAL FIELD

One embodiment of the present invention relates to a semiconductor device, an electronic component, and an electronic device.

BACKGROUND ART

In a system of electronic devices such as smartphones, a processor and various devices, e.g., a display device, a touch sensor device, a communication device, and a memory device, are connected via interfaces that correspond to each device.

Such a system stores setting information in a setup register in an interface and then operates (see Patent Document 1, for example). This operation is referred to as initialization. This initialization is required for interfaces each corresponding to a display device, a touch sensor device, a communication device, a memory device, or the like. Note that setting information is information on settings, such as the presence or absence of a target device, a type of the device, specifications of the device, and a driving method of the device. Such a configuration can increase the extensibility and versatility of the system. After the initialization, the system can operate normally.

For display devices, a structure using a transistor including an oxide semiconductor in a channel formation region (OS transistor) in a pixel is proposed (see Patent Document 2, for example). An OS transistor have an extremely low leakage current in an off state (off-state current), and thus can reduce the rewriting frequency (refresh operation) of video signals on the basis of image data in displaying a still image in order to reduce power consumption.

REFERENCES

Patent Documents

[Patent Document 1] United States Published Patent Application No. 2008/077725
[Patent Document 2] United States Published Patent Application No. 2011/149185

DISCLOSURE OF INVENTION

Using a display device with a structure disclosed in Patent Document 2, operations of a display driver, a display interface, and the like can be stopped during a period in which refresh operation of a video signal is stopped, or a period in which subsequent sending of an image data to the display device is not performed. Furthermore, power consumption can be reduced by stopping the supply of power supply voltage.

With a structure that stops the supply of power supply voltage to the display interface, when a display is switched from a still image to a moving image, i.e., when the frequency of refresh operation of the display device is restored, the display interface needs to supply power supply voltage and restart its operation before the display of the display device is switched.

However, when the setup register of the display interface is volatile, the setting information is lost by stopping the supply of the power supply voltage. Therefore, the setting information is initialized once again, as in the structure disclosed in Patent Document 1. In other words, stopping and restarting the operation of the display interface involve penalties of time and power consumption; this inhibits the power of the display interface from being frequently turned off. In other words, even when the display device is driven with a low refresh rate, the display interface needs to be supplied with the power supply voltage, thus making it difficult to lower power consumption.

An object of one embodiment of the present invention is to provide a semiconductor device that can reduce power consumption on the basis of the state of a device that is connected via an interface by eliminating initialization when the supply of power supply voltage to the interface is stopped and then restarted.

Another object of one embodiment of the present invention is to provide a semiconductor device that can reduce power consumption on the basis of the rewriting frequency of a video signal to a display device that is connected via a display interface by eliminating initialization when the supply of power supply voltage to the display interface is stopped and then restarted.

One embodiment of the present invention is a semiconductor device including a processor and an interface circuit with a register that stores setting information. The interface circuit has a function of transmitting signals that are input and output between the processor and a functional device. The register includes a first memory circuit that can store the setting information when power supply voltage is supplied and a second memory circuit that can store the setting information when the power supply voltage is not supplied. The interface circuit has a function of changing a state between a first state, a second state, a third state, and a fourth state in its operation. In the first state, the setting information is stored in the first memory. In the second state, the interface circuit operates on the basis of the setting information stored in the first memory circuit. In the third state, the setting information stored in the first memory circuit is stored in the second memory circuit and the supply of the power supply voltage is stopped. In the fourth state, the supply of the power supply voltage is restarted and the setting information stored in the second memory circuit is stored in the first memory circuit. The interface circuit has a function of changing a state between the second state, the third state and the fourth state on the basis of a state of the functional device.

One embodiment of the present invention is a semiconductor device preferably including a processor, an interface circuit with a register that stores setting information, and a frame memory. The interface circuit preferably has a function of transmitting signals that are input and output between the processor and a display panel. The register preferably includes a first memory circuit that can store the setting information when power supply voltage is supplied and a second memory circuit that can store the setting information when the power supply voltage is not supplied. The interface circuit preferably has a function of changing a state between a first state, a second state, a third state, and a fourth state. In the first state, the setting information is stored in the first memory circuit. In the second state, the interface circuit operates on the basis of the setting information stored in the first memory circuit. In the third state, the setting information stored in the first memory circuit is stored in the second memory circuit and the supply of the power supply voltage is stopped. In the fourth state, the supply of the power supply voltage is restarted and the setting information stored in the second memory circuit is stored in the first memory circuit. The display panel preferably has a function of changing a state between a moving image display state and a still image display state in its operation. In the moving image display state, a video signal is rewritten into a pixel. In the still image display state, the video signal is not rewritten into the pixel. The interface circuit preferably has a function of changing a state to the second state when the display panel is in the moving image display state, to the third state when the display panel changes its state from the still image display state, and to the second state via the fourth state when the display panel changes its state from the still image display state to the moving image display state.

In the semiconductor device according to one embodiment of the present invention, the second memory circuit preferably includes a first transistor and a second transistor. The first transistor preferably includes an oxide semiconductor in a semiconductor layer serving as a channel formation region. One of a source and a drain of the first transistor is preferably electrically connected to a gate of the second transistor. The first transistor preferably has a function of retaining charge in the gate of the second transistor when turned off.

In the semiconductor device according to one embodiment of the present invention, the frame memory preferably includes a third transistor. The third transistor preferably includes an oxide semiconductor in a semiconductor layer serving as a channel formation region, and preferably has a function of retaining charge of one of a source and a drain of the third transistor when turned off.

Note that other embodiments of the present invention will be shown in the following embodiments and the drawings.

One embodiment of the present invention can provide a semiconductor device that can reduce power consumption on the basis of the state of a device that is connected via an interface by eliminating initialization when the supply of power supply voltage to the interface is stopped and then restarted.

One embodiment of the present invention can provide a semiconductor device that can reduce power consumption on the basis of the rewriting frequency of a video signal to a display device that is connected via a display interface by eliminating initialization when the supply of power supply voltage to the display interface is stopped and then restarted.

BEST MODE FOR CARRYING OUT THE INVENTION

Hereinafter, embodiments will be described with reference to the drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

<Structure of Semiconductor Device>

A semiconductor device of the present invention will be described with reference to FIGS. 1A and 1B, FIGS. 2A and 2B, and FIGS. 3A and 3B.

In this specification and the like, a semiconductor device generally means a device that can function by utilizing semiconductor characteristics. For example, a semiconductor device is a device that includes a processor and an interface and that is connected to a target functional device via the interface. A specific example of such a semiconductor device is an application processor with interfaces corresponding to a display device, a touch sensor device, a communication device, a memory device, and the like.

Figure 1A:
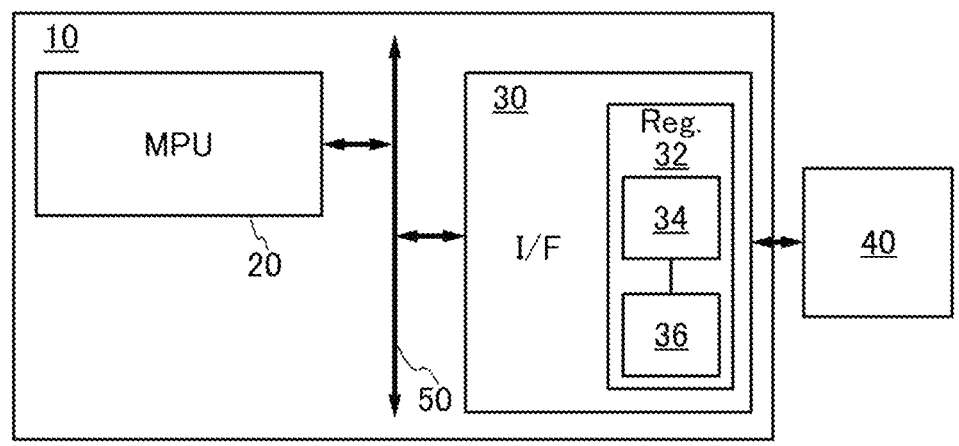
FIG. 1A is a block diagram illustrating a structure example of a semiconductor device.

FIG. 1A is a block diagram illustrating a semiconductor device of one embodiment of the present invention.

A semiconductor device 10 includes a micro processing unit (MPU, also simply referred to as a processor) 20, an interface 30 (hereinafter referred to as the I/F 30), and a system bus 50. The I/F 30 includes a register ("Reg." in the FIG. 32. The register 32 includes a memory circuit 34 and a memory circuit 36.

In addition to the semiconductor device 10, FIG. 1A illustrates a functional device 40. The functional device 40 transmits and receives signals to and from a circuit in the semiconductor device 10, e.g., the MPU 20, via the I/F 30.

The functional device 40 is a display device, a touch sensor device, a sensor device, a communication device, a memory device, or the like.

The MPU 20, for example, specifies an address of an external functional device or an internal memory device to read necessary data, and outputs data obtained with operation. The MPU 20 transmits and receives signals to and from another circuit in the semiconductor device 10 via the system bus 50.

The I/F 30 has a function of converting a signal to be output from the semiconductor device 10 into a signal that can be received by the functional device 40, or has a function of receiving a signal output from the functional device 40 and feeding the signal to the semiconductor device 10. In other words, the I/F 30 has a function of mediating input and output signals between the MPU 20 and the functional device 40.

In the case where the functional device 40 is a display, an example of the I/F 30 is a circuit that converts a signal into a signal compatible with interface standards such as DVI, HDMI (registered trademark), eDP, iDP, V-by-One HS, FPD-Link II, or Advanced PPmL. When the functional device 40 is a dynamic RAM (DRAM), an example of the I/F 30 is a circuit that converts a signal into a signal compatible with interface standards such as DDR, DDR2, or DDR3. Alternatively, an example of the I/F 30 is a circuit that converts a signal into a signal compatible with interface standards that can be generally applicable to various types of functional devices, such as PCI, PCT Express, I2C, or RS-232C.

The register 32 in the I/F 30 stores the setting information of the I/F 30. The setting information is information on settings, such as the presence or absence of a target functional device, a type of the functional device, specifications of the functional device, and a driving method of the functional device.

The memory circuit 34 and the memory circuit 36 in the register 32 can store the setting information. The memory circuit 34 can store the setting information when power supply voltage is supplied to the register 32. The memory circuit 36 can store the setting information when the supply of the power supply voltage to the register 32 is stopped.

The I/F 30 that includes the register 32 changes a state between first, second, third, and fourth states in its operation. The first state corresponds to a state in which the setting information is stored in the memory circuit 34, i.e., a state of initialization operation. The second state corresponds to a state in which the I/F 30 operates on the basis of the setting information stored in the memory circuit 34, i.e., a state of normal operation. The third state corresponds to a state in which the setting information stored in the memory circuit 34 is stored in the memory circuit 36 and the supply of power supply voltage is stopped, i.e., a state of stopping power. The fourth state corresponds to a state in which the supply of the power supply voltage is restarted to read the setting information stored in the memory circuit 36 into the memory circuit 34. Note that in this specification and the like, a "state" refers to an operation state of a circuit at a given point, as well as a continuous operation state of a circuit. Note that the first to fourth states can also be referred to as first to fourth operations.

To store the memory circuit 36 with the setting information stored in the memory circuit 34 is also referred to as "to store." To read the setting information stored in the memory circuit 36 into the memory circuit 34 is also referred to as "to load."

The first state in which the setting information is stored in the memory circuit 34 corresponds to a state of initialization operation. The second state in which the I/F 30 operates on the basis of the setting information stored in the memory circuit 34 corresponds to a state of normal operation. The third state in which the setting information stored in the memory circuit 34 is stored in the memory circuit 36 and the supply of power supply voltage is stopped corresponds to a state of stopping power. Stopping the power can reduce the power consumption of the semiconductor device 10.

Storing the memory circuit 36 with the setting information stored in the memory circuit 34 can prevent the setting information from being lost from the register 32 even when the power is stopped. The initialization operation in returning to the normal operation can be omitted by changing the state to the fourth state in which the supply of the power supply voltage is restarted and the setting information stored in the memory circuit 36 is loaded into memory circuit 34. Since initialization operation need not be re-performed, the power consumption for the initialization operation can be eliminated to achieve lower power consumption.

The above-described second to fourth states of the register 32 are preferably changed on the basis of the state of the functional device 40. For example, in the state where a signal is continually input/output between the semiconductor device 10 and the functional device 40, the register 32 is in the second state, i.e., the state of the normal operation. In the state where a signal is not input/output between the semiconductor device 10 and the functional device 40, the setting information stored in the memory circuit 34 is stored in the memory circuit 36, so that the register 32 is in the third state. In the state where a signal is again continually input/output between the semiconductor device 10 and the functional device 40, the state of the register 32 is changed to the second state, i.e., the state of the normal operation, via the fourth state, in which the supply of the power supply voltage is restarted and the setting information stored in the memory circuit 36 is loaded into the memory circuit 34.

The state in which a signal is continually input/output between the semiconductor device 10 and the functional device 40 corresponds to, for example, a moving image display state in the case where the functional device 40 is a display device. When a moving image is displayed, image data is continually output via a display interface. Conversely, the state in which a signal is not input/output between the semiconductor device 10 and the functional device 40 corresponds to, for example, a still image display state in the case where the functional device 40 is a display device. When a still image is displayed, by using a configuration that can retain a video signal based on image data for a long time for a pixel circuit of the display device, the display device can keep displaying an image without outputting image data to the display device via the display interface. Thus, even when the operation of the display interface is stopped during this period and the power is stopped, the display device can keep displaying an image.

In this specification, image data refers to a digital signal that is generated by an application processor and that corresponds to an image displayed by a display device, and a video signal refers to an analog signal that enables displaying gray scale when retained by a pixel circuit.

As an example of a structure for retaining a video signal based on image data in a pixel circuit of a display device for a long time to display a still image, a transistor that exhibits an extremely low leakage current (off-state current) when turned off is preferably used as a transistor in the pixel circuit. As such a transistor, an OS transistor is preferably used.

The memory circuit 36 can retain the setting information even when the power is stopped. Such a memory circuit is preferably a memory circuit including an OS transistor. One of a source and a drain of the OS transistor is connected to a gate of, for example, a transistor with a channel formation region including silicon (Si transistor), so that the charge in the gate of the Si transistor can be retained by turning off the OS transistor. Thus, the charge on the basis of the setting information can be retained even when the power is stopped.

Figure 1B:
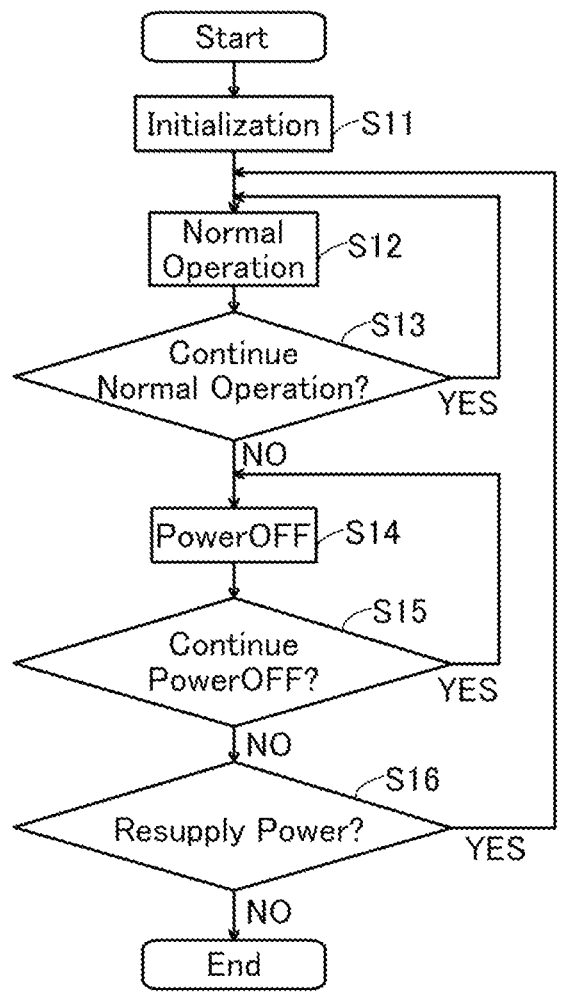
FIG. 1B is a flowchart.

FIG. 1B is a flowchart illustrating the transition between the above-described first to fourth states of the register 32. First, initialization is performed in a step S11. Then, normal operation is performed in a step S12. Next, in a step S13, whether to continue the state of the normal operation in the step S12 is determined; the state returns to the state in the step S12 to continue, or otherwise moves to the state in a step S14. The step S14 then stops the power. In a subsequent step S15, whether to continue the state of stopping the power in the step S14 is determined; the state returns to the state in the step S14 to continue, or otherwise moves to the state in a step S16. In the step S16, whether to resupply power supply voltage is determined; the state moves to the normal operation in the step S12 to resupply, or otherwise the operation terminates.

Figure 2A:
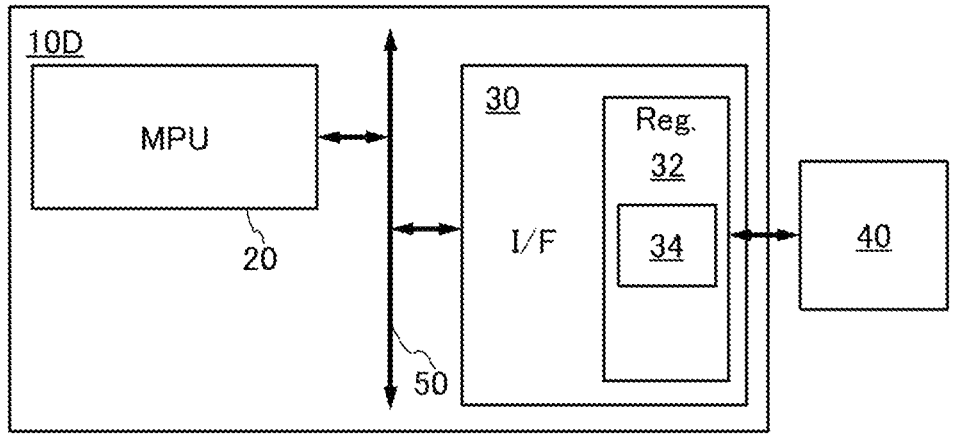
FIG. 2A is a block diagram illustrating a structure example of a semiconductor device.
Figure 2B:
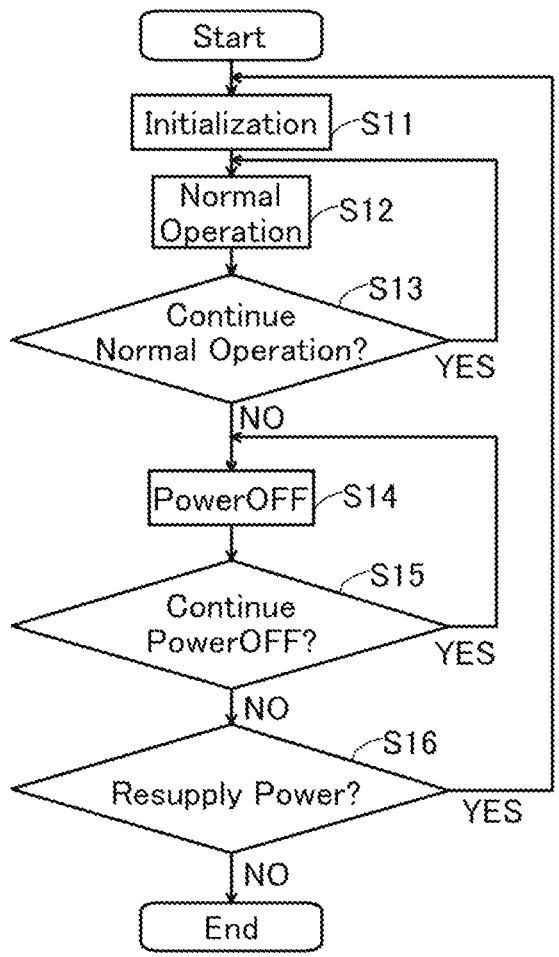
FIG. 2B is a flowchart.

As a comparative example, FIG. 2A illustrates a block diagram of a semiconductor device 10D, which does not include the memory circuit 36 illustrated in FIG. 1A.

The structure illustrated in FIG. 2A does not include the memory circuit 36 that can store the setting information when the power is stopped; thus, the setting information stored in the memory circuit 34 is lost when the power to the I/F 30 is stopped. Therefore, with the semiconductor device 10D, when the register 32 is determined to be resupplied with power supply voltage in the step S16 for determining whether to resupply power supply voltage as illustrated in the flowchart in FIG. 2B, the initialization in the step S11 needs to be re-performed. Since the initialization is necessary in every cycle of stop and restart of the supply of power supply voltage, the frequent stop of the power supply to the I/F 30 may cause an increase in power consumption.

In contrast, the structure in FIG. 1A, one embodiment of the present invention, stores the memory circuit 36 with the setting information stored in the memory circuit 34, and thus can prevent the setting information from being lost from the register 32 while the power is stopped. The setting information stored in the memory circuit 36 is loaded into the memory circuit 34 when the supply of power supply voltage is restarted, and thus initialization in returning to the normal operation can be omitted. Since the initialization operation need not be re-performed, the power consumption for the initialization operation can be eliminated to achieve lower power consumption.

Although FIG. 1A illustrates the MPU 20, the I/F 30, and the system bus 50 as the components of the semiconductor device 10, one embodiment of the present invention is not limited to this structure. For example, as a semiconductor device 10A illustrated in FIG. 3A, one embodiment of the present invention may include a power controller 21 (denoted by Power Ctrl. in the figure) and a static RAM 22 (hereinafter referred to as the SRAM 22), in addition to the components illustrated in FIG. 1A.

The power controller 21 has a function of, for example, stopping or restarting the supply of power supply voltage to the I/F 30 on the basis of the state of the functional device 40. With this structure, standby power of the register 32 can be reduced. The SRAM 22 can be used, for example, as a program memory or a working memory of the MPU 20.

Figure 3A:
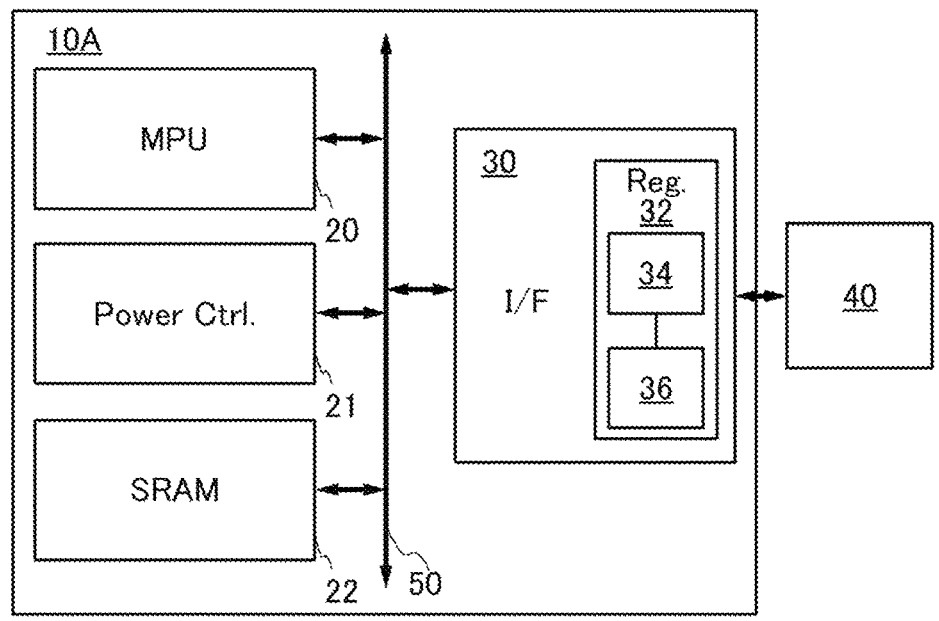
FIGS. 3A and 3B are block diagrams each illustrating a structure example of a semiconductor device.
Figure 3B:
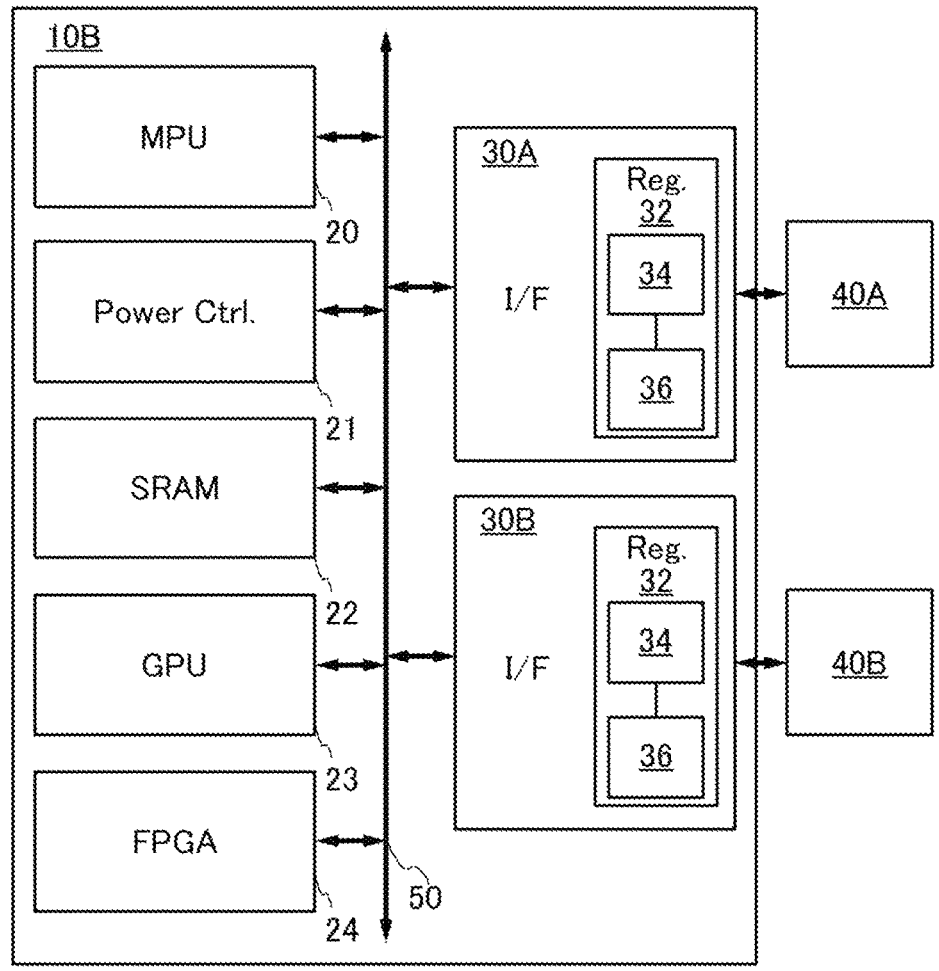

Although FIG. 3A illustrates the MPU 20, the I/F 30, the power controller 21, the SRAM 22, and the system bus 50 as the components of the semiconductor device 10A, one embodiment of the present invention is not limited to this structure. For example, as in a semiconductor device 10B illustrated in FIG. 3B, one embodiment of the present invention may include an I/F 30A and an I/F 30B corresponding to a functional device 40A and a functional device 40B, respectively, and may include a graphic processing unit (GPU) 23 and a field programmable gate array (FPGA) 24.

Although the structures of the functional devices 40A and 40B are not limited to any specific structures, the functional devices 40A and 40B correspond to, for example, a display device and a touch sensor device. In this case, the operations of the functional devices 40A and 40B are interrelated. For example, the display on the display device can be changed on the basis of the presence or the absence of the touch detection by the touch sensor device. Specifically, when a touch is detected, power supply voltage to an interface connected to the touch sensor device can be supplied; when a touch is not detected, the supply of power supply voltage to the interface connected to the touch sensor can be stopped while the display device displays a still image. Thus, the power consumption of the entire system including the semiconductor device can be lowered.

It is effective to provide the GPU 23 and the FPGA 24, when, for example, the semiconductor device 10B is used as an application processor. With such a structure, a part of processing of the MPU 20 can be shared by the GPU 23 and the FPGA 24, and the performance of the semiconductor device 10B can be improved. A structure in which the GPU 23 is provided in a display interface may be used. Alternatively, a structure in which the FPGA 24 is provided in an interface may be used. As described above, the semiconductor device of one embodiment of the present invention includes various circuits on the basis of functional devices, and can be connected to the functional devices via interfaces.

<Application Example of Application Processor>

Application examples of the semiconductor device 10 illustrated in FIG. 1A to an application processor are described, with reference to FIG. 4, FIGS. 5A and 5B, FIGS. 6A and 6B, and FIGS. 7A and 7B.

Figure 4:
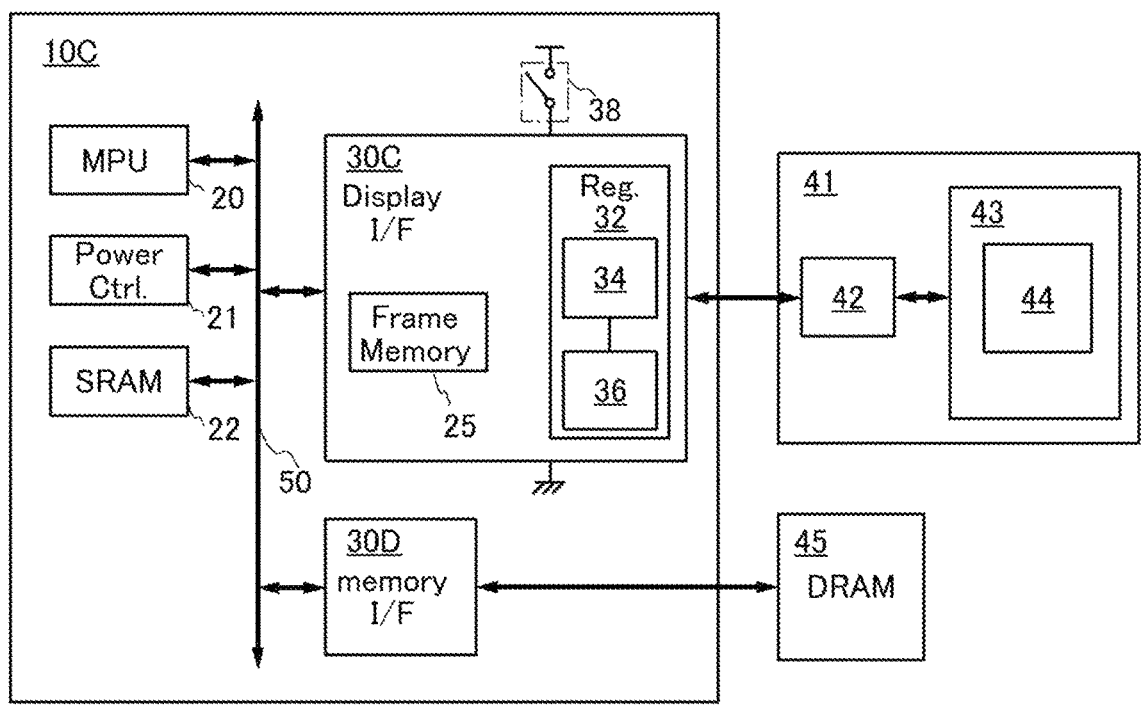
FIG. 4 is a block diagram illustrating a structure example of a semiconductor device.

FIG. 4 is a block diagram illustrating an application processor of one embodiment of the present invention.

An application processor 10C includes the MPU 20, the power controller 21, the SRAM 22, a display interface 30C (hereinafter referred to as the display I/F 30C), a memory interface 30D (hereinafter referred to as the memory I/F 30D), a switch 38, and the system bus 50. The display I/F 30C includes a frame memory 25 and the register 32. The register 32 includes the memory circuit 34 and the memory circuit 36.

In addition to the application processor 10C, FIG. 4 illustrates a display device 41 and a DRAM 45. The display device 41 includes a display controller 42 and a display portion 43. The display portion 43 includes a pixel 44. The display controller 42 transmits and receives image data to and from the frame memory 25 included in the display I/F 30C. The DRAM 45 transmits and receives image data to and from the memory I/F 30D.

Although FIG. 4 illustrates the display device 41 and the DRAM 45 as functional devices and the display I/F 30C and the memory I/F 30D as interfaces, the application processor 10C may be connected to another functional device via another interface. Such a functional device is, for example, a touch sensor device, a sensor device, or a communication device.

The MPU 20 performs operation on input data so that the obtained data is stored in the frame memory 25. For example, the MPU 20 performs operation to convert image data that is input from the DRAM 45 into a given format, so that the data is stored in the frame memory 25. The MPU 20 generates a signal to control the power controller 21, the SRAM 22, the display I/F 30C, the memory I/F 30D, and the like, on the basis of a display state of the display device 41 and a state of the display I/F 30C. The MPU 20 and the other circuits in the application processor 10C exchange signals via the system bus 50.

The display I/F 30C has a function of converting a signal to be output from the application processor 10C into a signal that can be input to the display controller 42, or converting a signal output from the display controller 42 into a signal that can be input to the application processor 10C. In other words, the display I/F 30C has a function of transmitting signals input/output between the MPU 20 and the display device 41. The switch 38 is provided between the display I/F 30C and a wiring that supplies power supply voltage to the display I/F 30C, and can stop the supply of the power supply voltage when turned off.

Examples of the display I/F 30C are DVI, HDMI (a registered trademark), digital RGB, analog RGB, and the like.

The memory I/F 30D has a function of converting a signal into a signal compatible with interface standards. An example of the memory I/F 30D is a circuit that converts a signal into a signal compatible with interface standards such as DDR, DDR2, or DDR3. Although not illustrated in FIG. 4, the memory I/F 30D includes the register 32, as with the display I/F 30C. The register 32 included in the memory I/F 30D may include the memory circuits 34 and 36, or may include the memory circuit 34.

The register 32 included in the display I/F 30C stores the setting information of the display I/F 30C. The setting information is information on settings such as the presence or absence of a target display device, a type of the display device, specifications of the display device, and a driving method of the display device.

The memory circuit 34 and the memory circuit 36 which are included in the register 32 can store the setting information. The memory circuit 34 is a memory circuit that can store the setting information while power supply voltage is supplied to the register 32. The memory circuit 36 is a memory circuit that can store the setting information while the supply of the power supply voltage to the register 32 is stopped.

The display controller 42 generates a variety of signals such as a video signal for the display portion 43 to display gray scale, and a clock signal and a start pulse for driving the display portion 43, on the basis of image data input via the display I/F 30C. The display portion 43 includes a plurality of pixels 44. The plurality of pixels 44 each includes a transistor and a display element used for displaying gray scale on the basis of the video signal.

The display I/F 30C including the register 32 can take the first to fourth states as illustrated in FIGS. 1A and 1B: the first state of initialization operation, the second state of normal operation, the third state of stopping the power, and the fourth state of restarting the supply of power supply voltage. These operations can be controlled by the MPU 20.

The register 32 can take the second to fourth states, and thus can prevent the setting information stored in the register 32 from being lost even when the power is stopped. Furthermore, the initialization operation in returning to the normal operation can be omitted. Since the initialization operation need not be re-performed, the power consumption for the initialization operation can be eliminated to achieve lower power consumption.

The above-described second to fourth states of the register 32 are preferably changed on the basis of the state of the display device 41. The display device 41 can display a moving image or a still image on the display portion 43. Here, an example of states that the display device 41 can take is described with reference to FIG. 5A.

Figure 5A:
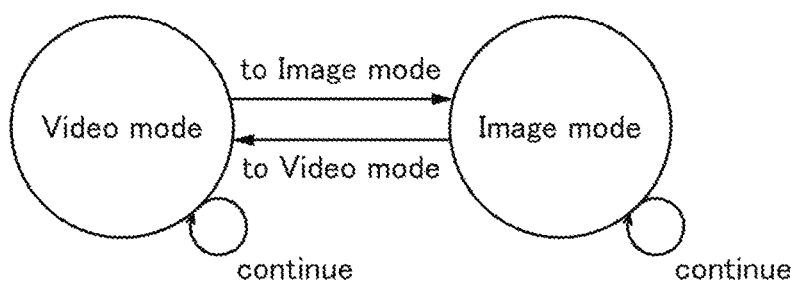
FIGS. 5A and 5B are state transition diagrams each illustrating a state example of a semiconductor device.

The display mode of the display portion 43 changes between two modes, as illustrated in FIG. 5A. As an example, FIG. 5A illustrates a moving image display mode ("Video mode" in the figure) and a still image display mode ("Image mode" in the figure). Comparing image data between two consecutive frame periods can determine whether to continue the moving image display mode, to switch the moving image display mode into the still image display mode, to continue the still image display mode, or to switch the still image display mode into the moving image display mode. For example, when image data of the two consecutive frame periods are the same during the moving image display mode, the moving image display mode is changed to the still image display mode. When image data of the two consecutive frame periods are different during the moving image display mode, the moving image display mode is continued. When image data of the two consecutive frame periods are the same during the still image display mode, the still image display mode is continued. When image data of the two consecutive frame periods are different during the still image display mode, the still image display mode is changed to the moving image display mode.

As the transistor of the pixel 44 in the display portion 43, an OS transistor which has extremely low off-state current is used. With the use of an OS transistor, by keeping the transistor turned off, the pixel 44 can retain a video signal based on image data for a long time during the still image display mode. Thus, during the still image display mode, an image can be kept displayed without outputting image data to the display controller 42 via the display I/F 30C. Consequently, an image can be kept displayed even when the function of the display I/F 30C is stropped and the power supply voltage is not supplied during this mode.

Figure 5B:
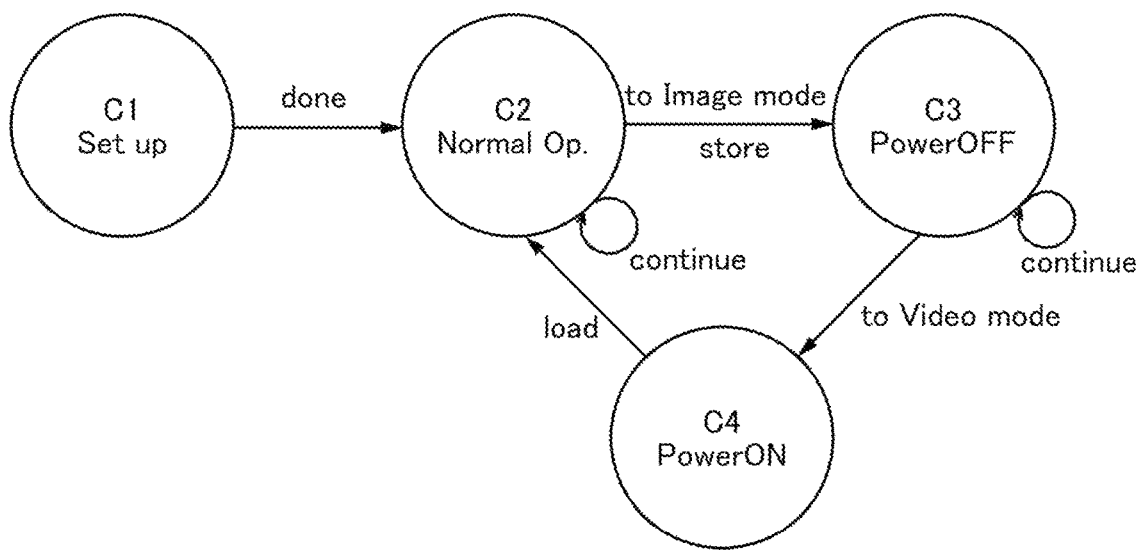

States that the display I/F 30C can take are described with reference to FIG. 5B. First to fourth states C1 to C4 illustrated in FIG. 5B correspond to the first to fourth states illustrated in FIGS. 1A and 1B, respectively. That is to say, the first state C1 is a state of initialization operation ("Set Up" in the figure), the second state C2 is a state of normal operation ("Normal Op." in the figure), the third state C3 is a state in which the setting information stored in the memory circuit 34 is stored in the memory circuit 36, and the supply of power supply voltage is stopped ("PowerOFF" in the figure), and the fourth state C4 is a state in which the supply of power supply voltage is restarted to load the setting information stored in the memory circuit 36 into the memory circuit 34 ("PowerON" in the figure).

For example, when the above-described display device 41 remains in the moving image display mode, the display I/F 30C remains in the second state, i.e., the state of the normal operation. When the above-described display device 41 changes its mode from the moving image display mode to the still image display mode, the display I/F 30C stores the setting information and changes its state into the third state. When the display device 41 remains in the still image display mode, the display I/F 30C remains in the third state, i.e., the state of stopping the power. When the display device 41 changes its mode from the still image display mode to the moving image display mode, the display I/F 30C changes its state, via the fourth state in which the supply of the power supply voltage is restarted to load the setting data, to the second state.

FIGS. 6A and 6B and FIGS. 7A and 7B illustrate signal flows in the application processor 10C and the display device 41 corresponding to the first state C1, the second state C2, the third state C3, and the fourth state C4 of the display I/F 30C described above. Note that in FIGS. 6A and 6B and FIGS. 7A and 7B, dashed arrows represent schematic signal flows input/output between blocks.

Figure 6A:
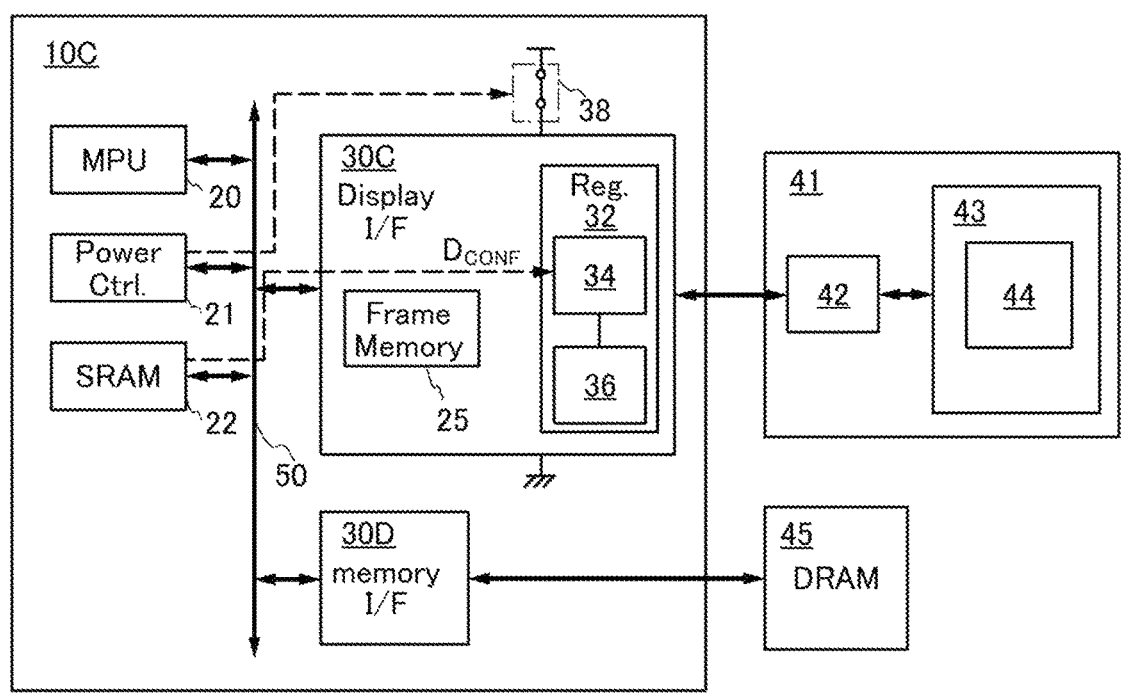
FIGS. 6A and 6B are block diagrams each illustrating a structure example of a semiconductor device.

FIG. 6A corresponds to the first state C1 of the display I/F 30C described above, and illustrates signal flows in the application processor 10C and the display device 41. As illustrated in FIG. 6A, in the first state C1, to perform the initialization operation, setting information $D_{CONF}$ stored in the SRAM 22 is stored in the memory circuit 34 in the register 32 via the system bus 50. At this point, the switch 38 is controlled by the power controller 21 to be turned on. Possible structures that enable the above described operation include a structure in which the setting information $D_{CONF}$ is directly sent from the SRAM 22 to the display I/F 30C using a method such as direct memory access (DMA), and a structure in which the MPU 20 sequentially reads the setting information $D_{CONF}$ from the SRAM 22 and writes the setting information $D_{CONF}$ into the display I/F 30C using a program. The former structure is used in FIG. 6A.

Figure 6B:
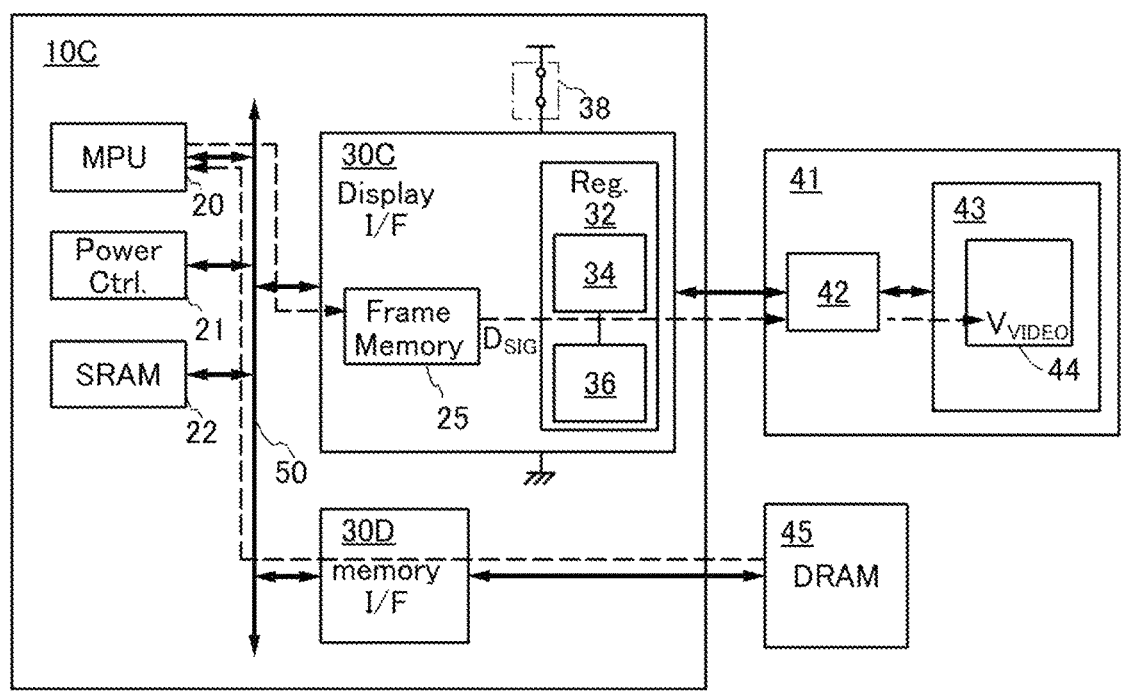

FIG. 6B corresponds to the second state C2 of the display I/F 30C described above, and illustrates signal flows in the application processor 10C and the display device 41. As illustrated in FIG. 6B, in the second state C2, to perform the normal operation, image data obtained by converting image data input from the DRAM 45 into a given format through operation by the MPU 20 is stored in the frame memory 25 in the display I/F 30C. The display I/F 30C outputs image data $D_{SIG}$ stored in the frame memory 25 to the display controller 42. The display controller 42 generates a video signal $V_{VIDEO}$ on the basis of the image data $D_{SIG}$, and writes the video signal $V_{VIDEO}$ into the pixel 44 of the display portion 43. Since the display I/F 30C continuously outputs the image data $D_{SIG}$, the switch 38 is turned on.

Figure 7A:
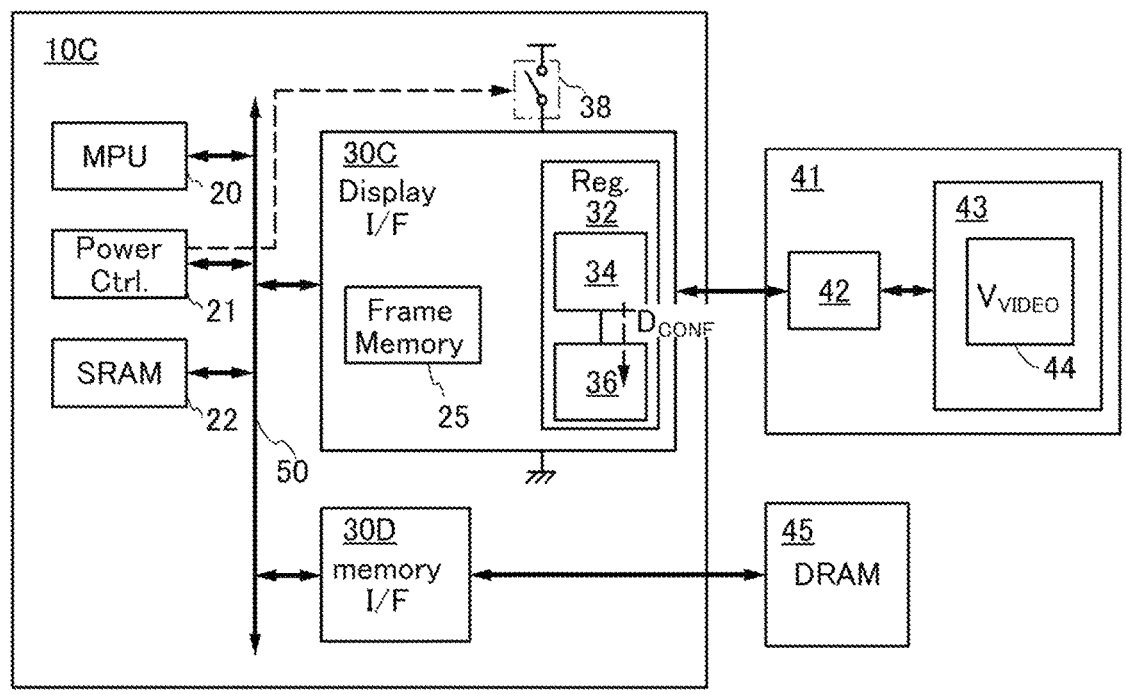
FIGS. 7A and 7B are block diagrams each illustrating a structure example of a semiconductor device.

FIG. 7A corresponds to the third state C3 of the display I/F 30C described above, and illustrates signal flows in the application processor 10C and the display device 41. As illustrated in FIG. 7A, in the third state C3, the pixel 44 retains the video signal $V_{VIDEO}$. The supply of the image data $D_{SIG}$ to the display controller 42 via the display I/F 30C can be eliminated in this state. Thus, the power controller 21 can turn off the switch 38 to stop the supply of the power supply voltage to the display I/F 30C. Since the setting information $D_{CONF}$ in the register 32 will be lost by stopping the supply of power supply voltage, the setting information $D_{CONF}$ is stored from the memory circuit 34 to the memory circuit 36 in advance. Adopting the structure enables the register 32 to store the setting information $D_{CONF}$ even when the supply of power supply voltage is stopped.

Figure 7B:
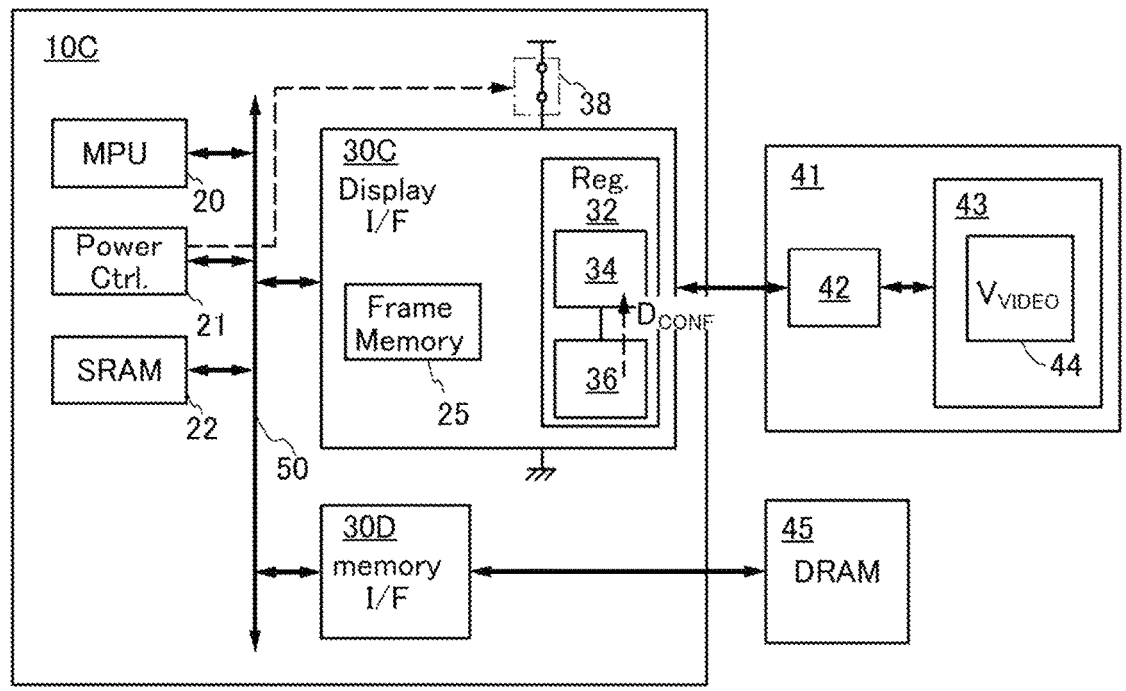

FIG. 7B corresponds to the fourth state C4 of the display I/F 30C described above, and illustrates signal flows in the application processor 10C and the display device 41. As illustrated in FIG. 7B, in the fourth state C4, the pixel 44 retains the video signal $V_{VIDEO}$. From this state, to renew the video signal $V_{VIDEO}$ in the pixel 44, the image data $D_{SIG}$ needs to be resupplied to the display controller 42 via the display I/F 30C. Thus, the power controller 21 turns on the switch 38, and the supply of the power supply voltage to the display I/F 30C is restarted. The setting information $D_{CONF}$ in the register 32 is loaded from the memory circuit 36 to the memory circuit 34. Adopting this structure enables return to the normal operation of the second state C2 not via the first state C1 in which the initialization operation is performed.

Note that a memory cell that can retain data for a given period while the supply of the power supply voltage to the display I/F 30C is stopped is preferably used as the frame memory 25, as illustrated in FIG. 7A. For example, a memory cell including an OS transistor is preferable. When one of a source and a drain of the OS transistor is connected to a gate of a Si transistor and the OS transistor is turned off, charge of the gate of the Si transistor can be retained. Thus, even when the supply of power supply voltage is stopped, charge on the basis of the setting information can be retained.

<Memory Cell Applicable to Register>

Figure 8A:
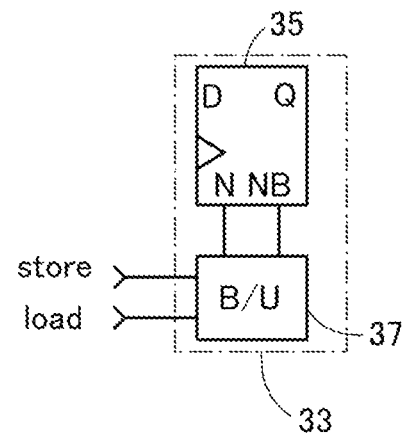
FIGS. 8A and 8B are block diagrams each illustrating a structure example of a semiconductor device.
Figure 8B:
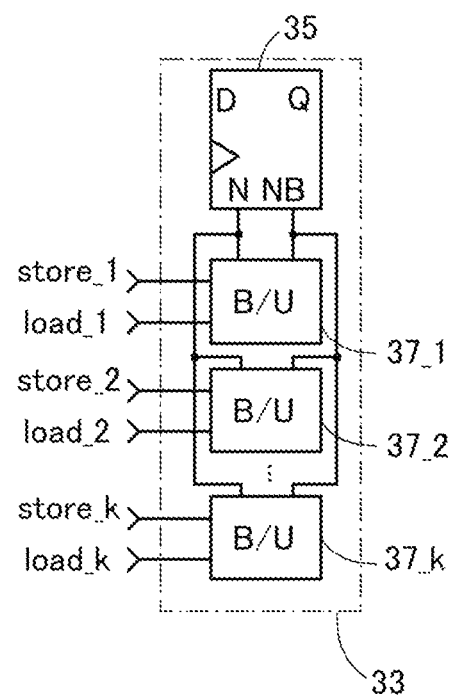
Figure 9:
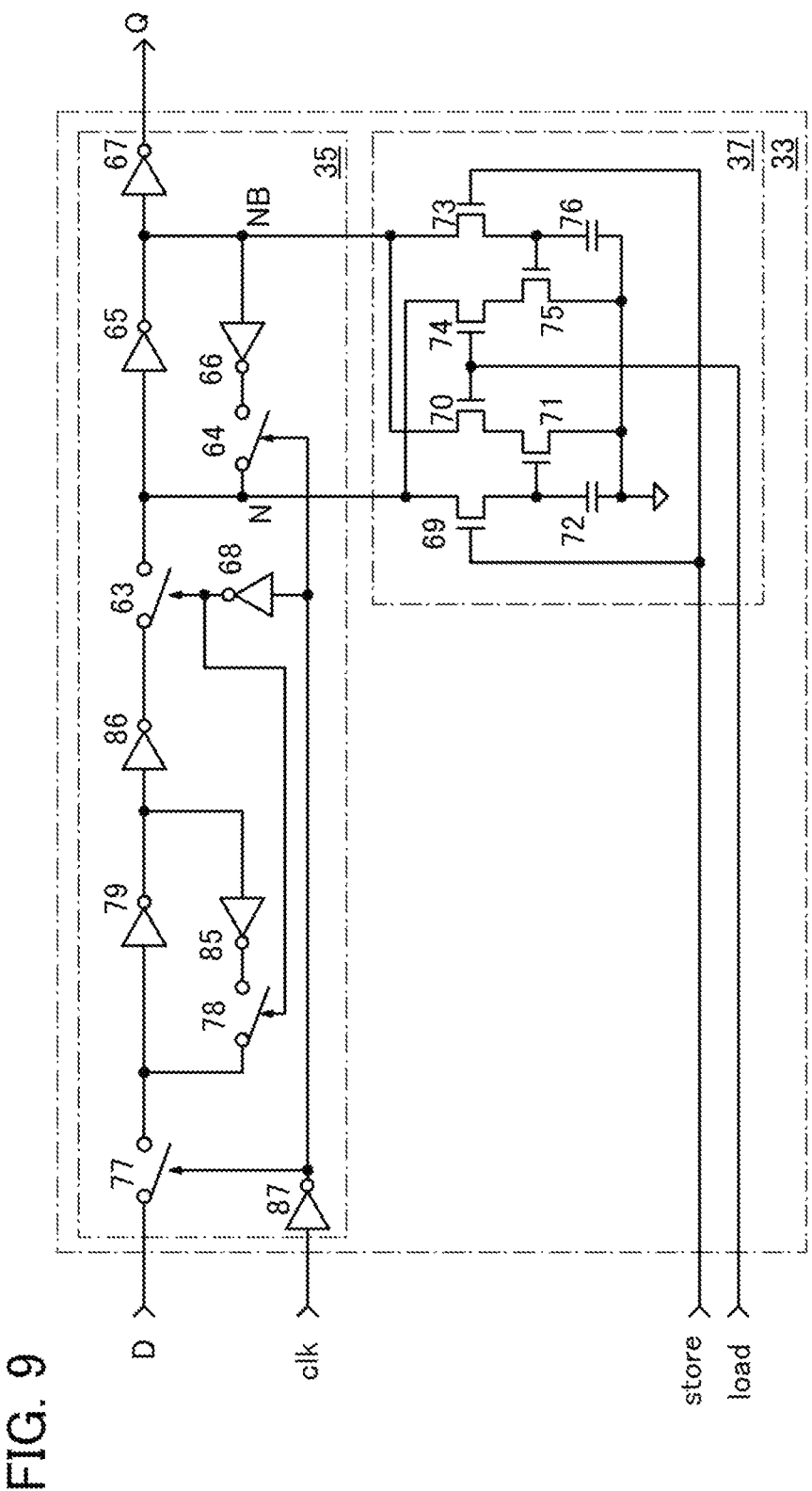
FIG. 9 is a circuit diagram illustrating a structure example of a semiconductor device.

FIGS. 8A and 8B, and FIG. 9 each illustrate a structure example applicable to the register 32 described above.

The register 32 includes a memory circuit that can store data corresponding to setting information while power supply voltage is supplied, and a memory circuit that can store the data corresponding to the setting information while the supply of power supply voltage is stopped. As a register including such memory circuits, a flip-flop with a backup function illustrated in FIG. 8A can be used.

A flip-flop 33 with a backup function illustrated in FIG. 8A includes a flip-flop 35 and a backup circuit ("B/U" in the figure) 37.

The flip-flop 35 has a function of storing or outputting input data on the basis of a logic of a clock signal clk.

A backup data write signal store and a backup data read signal load are input to the backup circuit 37. On the basis of the backup data write signal store, the backup circuit 37 is supplied with voltage of a node N in the flip-flop 35 and voltage of a node NB that stores an inverted logic of the node N. The voltage of the node N and the voltage of the node NB which are stored in the backup circuit 37 are supplied to the node N and the node NB in the flip-flop 35 on the basis of the backup data read signal load.

Note that in the flip-flop 33 with a backup function, a plurality of backup circuits 37 may be provided for the flip-flop 35, as illustrated in FIG. 8B. Any one of backup circuits 37_1 to 37_k (k is a natural number) is supplied with voltage of the node N in the flip-flop 35 and voltage of the node NB that stores an inverted logic of the node N, on the basis of any one of backup data write signals store_1 to store_k. The voltage of the node N and the voltage of the node NB which are stored in any one of the backup circuits 37_1 to 37_k are supplied to the node N and the node NB in the flip-flop 35, on the basis of any one of the backup data read signals load_1 to load_k. Adopting this structure allows the register 32 to store a plurality of pieces of setting information.

FIG. 9 illustrates an structure example of the flip-flop 33 with a backup function.

The flip-flop 33 with a backup function includes the flip-flop 35 and the backup circuit 37. The flip-flop 35 includes a switch 63, a switch 64, an inverter circuit 65, an inverter circuit 66, an inverter circuit 67, an inverter circuit 68, a switch 77, a switch 78, an inverter circuit 79, an inverter circuit 85, an inverter circuit 86, and an inverter circuit 87. The backup circuit 37 includes a transistor 69, a transistor 70, a transistor 71, a capacitor 72, a transistor 73, a transistor 74, a transistor 75, and a capacitor 76.

The on/off states of the switch 63, the switch 64, the switch 77, and the switch 78 are controlled by the clock signal clk. Each switch is turned on and off when, for example, the clock signal clk is at a low level and at a high level, respectively.

The flip-flop 35 stores data D when the clock signal clk becomes low and subsequently becomes high. With the switch 64 turned on, the flip-flop 35 keeps storing the stored data D as an output signal Q.

A gate of the transistor 69 is connected to a wiring through which the backup data write signal store is supplied and a gate of the transistor 73. One of a source and a drain of the transistor 69 is connected to the node N in the flip-flop 35. The other of the source and the drain of the transistor 69 is connected to a gate of the transistor 71 and one electrode of the capacitor 72.

A gate of the transistor 70 is connected to a wiring through which the backup data read signal load is supplied and a gate of the transistor 74. One of a source and a drain of the transistor 70 is connected to the node NB in the flip-flop 35. The other of the source and the drain of the transistor 70 is connected to one of a source and a drain of the transistor 71.

The other of the source and the drain of the transistor 71 is supplied with a ground potential.

The other electrode of the capacitor 72 is supplied with a ground potential.

The gate of the transistor 73 is connected to the wiring through which the backup data write signal store is supplied and the gate of the transistor 69. One of a source and a drain of the transistor 73 is connected to the node NB in the flip-flop 35. The other of the source and the drain of the transistor 73 is connected to a gate of the transistor 75 and one electrode of the capacitor 76.

The gate of the transistor 74 is connected to the wiring through which the backup data read signal load is supplied and the gate of the transistor 70. One of a source and a drain of the transistor 74 is connected to the node N in the flip-flop 35. The other of the source and the drain of the transistor 74 is connected to one of a source and a drain of the transistor 75.

The other of the source and the drain of the transistor 75 is supplied with a ground potential.

The other electrode of the capacitor 76 is supplied with a ground potential.

The transistor 69 and the transistor 73 are transistors with extremely low leakage currents when turned off (off-state current). As such a transistor, an OS transistor is preferably used. When OS transistors are used as the transistor 69 and the transistor 73, the charge on the basis of data stored in the capacitor 72 and the capacitor 76 can be retained by keeping the transistor 69 and the transistor 74 turned off.

Data in the flip-flop 35 can be written to the backup circuit 37 in the following manner. First, the backup data write signal store is set to be high, turning on the transistor 69 and the transistor 73. The capacitor 72 and the capacitor 76 in the backup circuit 37 are supplied with charges on the basis of the voltage of the node N and the voltage of the node NB. Then, the backup data write signal store is set to be low level, turning off the transistor 69 and the transistor 73. By keeping the transistor 69 and the transistor 73 turned off, charges on the basis of data stored in the capacitor 72 and the capacitor 76 can be retained.

Data is loaded from the backup circuit 37 to the flip-flop 35 in the following manner. First, the backup data read signal load is set to be high, turning on the transistor 70 and the transistor 74. In the backup circuit 37, the channel resistance of the transistor 71 and the channel resistance of the transistor 75 are different due to the charges on the basis of the data. With this state, restarting the supply of the power supply voltage to the backup circuit 37 causes a potential difference between the node N and the node NB, and thus the data can be loaded from the backup circuit 37 into the flip-flop 35.

<Memory Cell Applicable to Frame Memory>

FIGS. 10A to 10F each illustrate a structure example applicable to the frame memory 25 described above.

Figure 10A:
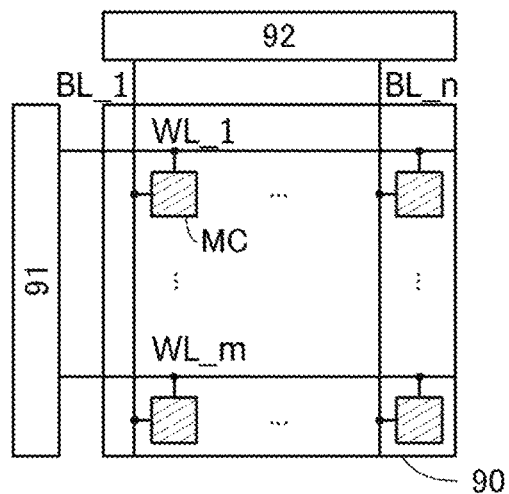
FIGS. 10A to 10F are a block diagram and circuit diagrams each illustrating a structure example of a semiconductor device.

FIG. 10A is a block diagram illustrating a structure example of the frame memory 25. The block diagram in FIG. 10A illustrates a memory cell array 90, a word line driver circuit 91, and a bit line driver circuit 92.

In the memory cell array 90, memory cells MC are arranged in a matrix of m rows and n columns (m and n are each a natural number). The memory cells MC are connected to word lines WL_1 to WL_m and bit lines BL_1 to BL_n. In addition to the bit lines and the word lines, the memory cells MC may be connected to a source line for supplying current, a wiring for applying voltage to a back gate of a transistor, a capacitor line for fixing a potential of one electrode of a capacitor, or the like.

The word line driver circuit 91 is a circuit that outputs a signal for selecting the memory cells MC in each row. Word lines for data writing and word lines for data reading may be provided separately as the word lines WL_1 to WL_m.

The bit line driver circuit 92 is a circuit for writing data into the memory cell MC of each column, or for reading out data from the memory cells MC. Bit lines for data writing and bit lines for data reading may be provided separately as the bit lines BL_1 to BL_n.

FIGS. 10B to 10F each illustrate an example of a circuit structure of the memory cell MC illustrated in FIG. 10A.

Figure 10B:
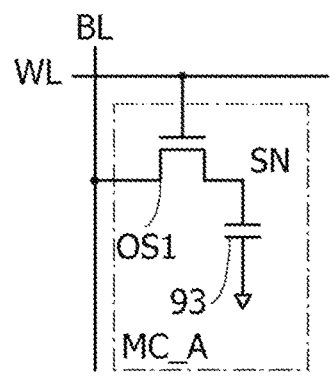

A memory cell MC_A illustrated in FIG. 10B includes a transistor OS1 and a capacitor 93. The transistor OS1 is an OS transistor. One of features of an OS transistor is an extremely low off-state current. Therefore, turning off the transistor OS1 allows a charge retention node SN to retain charge on the basis of data, and can reduce the refresh rate of the data stored in the charge retention node SN.

Figure 10C:
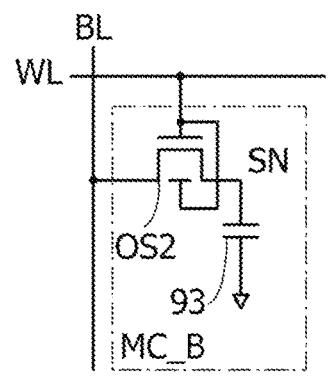

A memory cell MC_B illustrated in FIG. 10C includes a transistor OS2 and the capacitor 93. The transistor OS2 is an OS transistor. The transistor OS2 differs from the transistor OS1 illustrated in FIG. 10B in that a gate and a back gate are electrically connected to each other and voltage of the word line WL is applied from both the gate and the back gate. Adopting such a structure can increase the amount of current flowing between a source and a drain when the transistor OS2 is turned on.

Figure 10D:
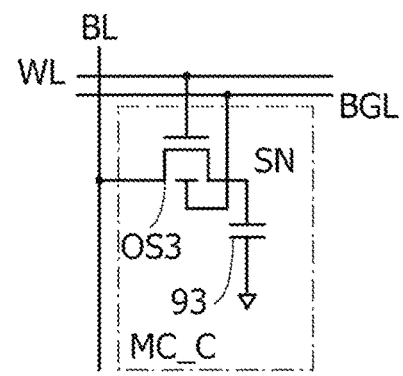

A memory cell MC_C illustrated in FIG. 10D includes a transistor OS3 and the capacitor 93. The transistor OS3 is an OS transistor. The transistor OS3 differs from the transistor OS1 illustrated in FIG. 10B in that a back gate and a back gate line BGL are electrically connected with each other and voltage applied to the back gate is different from voltage applied to a gate. Adopting such a structure enables control of the amount of current flowing between a source and a drain by controlling threshold voltage of the transistor OS3.

Figure 10E:
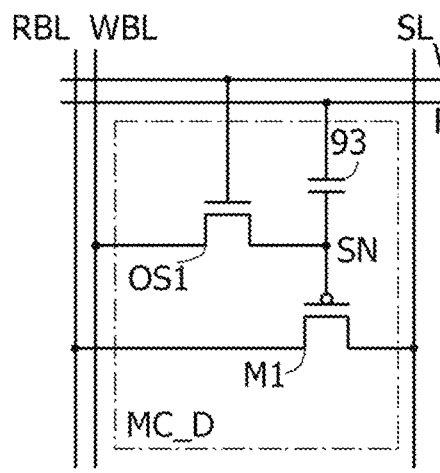

A memory cell MC_D illustrated in FIG. 10E includes the transistor OS1, a transistor M1, and the capacitor 93. One of a source and a drain of the transistor OS1 is connected to a write bit line WBL. The other of the source and the drain of the transistor OS1 is connected to a gate of the transistor M1 and one electrode of the capacitor 93. A gate of the transistor OS1 is connected to a write word line WWL. The other electrode of the capacitor 93 is electrically connected to a read word line RWL. One of a source and a drain of the transistor M1 is connected to a read bit line RBL. The other of the source and the drain of the transistor M1 is connected to a source line SL. Although the transistor M1 is a p-channel transistor in the figure, the transistor M1 may be an n-channel transistor. Turning off the transistor OS1 allows the charge retention node SN to retain charge on the basis of data. The transistors M1 is a transistor with a channel formation region including silicon (Si transistor). Note that the transistor OS1 may have the same structure as the transistor OS2 or OS3 described above.

Figure 10F:
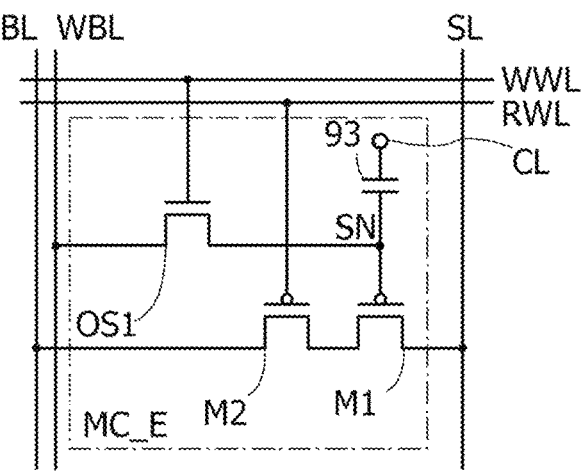

A memory cell MC_E illustrated in FIG. 10F includes the transistor OS1, the transistor M1, a transistor M2, and the capacitor 93. One of a source and a drain of the transistor OS1 is connected to the write bit line WBL. The other of the source and the drain of the transistor OS1 is connected to a gate of the transistor M1 and one electrode of the capacitor 93. A gate of the transistor OS1 is connected to the write word line WWL. The other electrode of the capacitor 93 is connected to the capacitor line CL. One of a source and a drain of the transistor M1 is connected to one of a source and a drain of the transistor M2. The other of the source and the drain of the transistor M1 is connected to the source line SL. A gate of the transistor M2 is connected to the read word line RWL. The other of the source and the drain of the transistor M2 is connected to the read bit line RBL. Although the transistor M2 is a p-channel transistor in the figure, the transistor M2 may be an n-channel transistor. Turning off the transistor OS1 allows the charge retention node SN to retain charge on the basis of data. The transistor M2 is a Si transistor. Note that the transistor OS1 may have the same structure as the transistor OS2 or OS3 described above.

Note that the structures of the memory cells illustrated in FIGS. 10B to 10F are effective especially when image data to be stored by the frame memory is increased. Compared with the structure with a static RAM (SRAM) as a memory cell of a frame memory, the structure with one to three memory cells can inhibit an increase in a circuit area. In particular, the structures of the memory cells illustrated in FIGS. 10B to 10D are effective in inhibiting an increase in a circuit area.

Furthermore, it is effective to use a structure in which any of the memory cell illustrated in FIGS. 10B to 10D and the memory cell illustrated in FIG. 10E or 10F in combination in a frame memory. The memory cells illustrated in FIGS. 10E and 10F are each used as a nonvolatile memory by electrically connecting the other of the source and the drain of the OS transistor to the gate of the Si transistor for retaining charge. With the nonvolatile memory storing data in advance, the nonvolatile memory and a memory cell with a low refresh rate, for example, can be embedded in the frame memory, readily enabling the decoding of image data input from the outside.

Such a structure is effective especially when image data to be stored by the frame memory is increased. In the case where the memory cell of the frame memory is configured by a dynamic RAM (DRAM), an additional nonvolatile memory needs to be embedded; this complicates a fabrication process and increases manufacturing costs. Adopting the structure in which a nonvolatile memory using an OS transistor is embedded in the frame memory enables compressing and decoding image data without increasing manufacturing costs.

Note that the circuit structures illustrated in FIGS. 10B to 10F are merely examples, and any other structures can be employed as long as one embodiment of the present invention can be achieved.

<Manufacturing Method Example of Electronic Component>

Figure 11A:
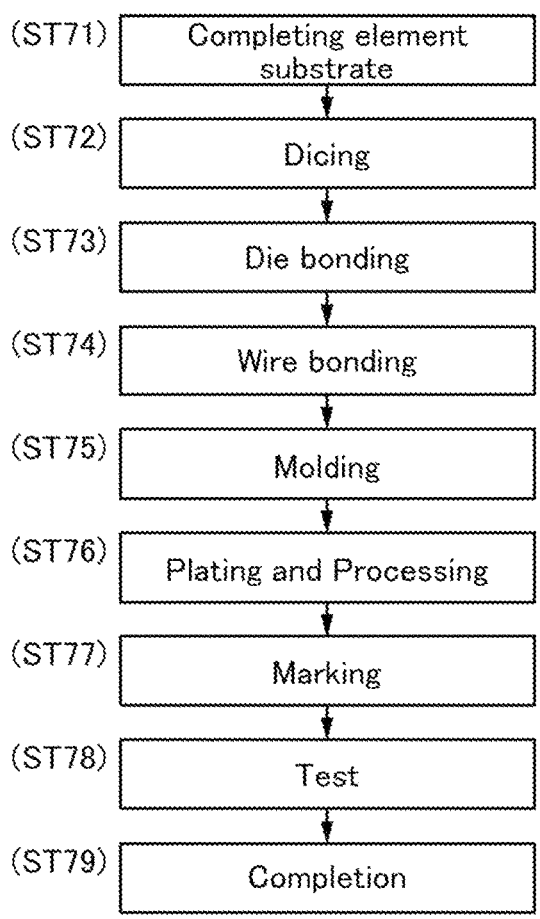
FIG. 11A is a flowchart illustrating an example of a method for manufacturing an electronic component.

FIG. 11A is a flow chart showing an example of a method for fabricating an electronic component. The electronic component is also referred to as a semiconductor package or an IC package. This electronic component has a plurality of standards and names depending on a terminal extraction direction and a terminal shape. Thus, examples of the electronic component are described in this embodiment.

A semiconductor device including a transistor is completed by integrating detachable components on a printed board through the assembly process (post-process). The post-process can be finished through the steps in FIG. 11A. Specifically, after an element substrate obtained in the pre-process is completed (Step ST71), a back surface of the substrate is ground. The substrate is thinned in this step to reduce warpage or the like of the substrate in the preceding process and to reduce the size of the component. Then, a dicing step of dividing the substrate into a plurality of chips is performed (Step ST72).

Figure 11B:
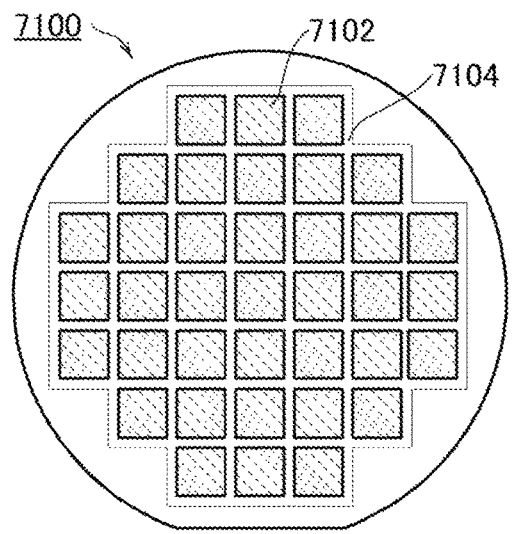
FIG. 11B is a top view illustrating a semiconductor wafer before a dicing process.
Figure 11C:
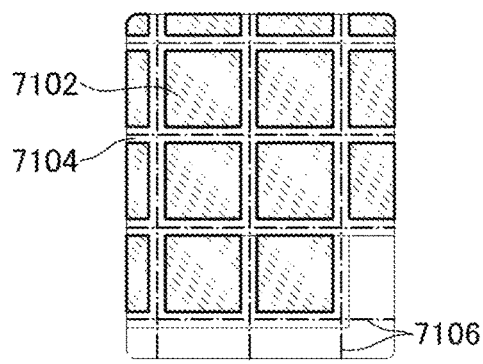
FIG. 11C is an enlarged view of part of FIG. 11B.

FIG. 11B is a top view illustrating a semiconductor wafer 7100 before a dicing process. FIG. 11C is an enlarged view of part of FIG. 11B. A plurality of circuit regions 7102 is provided on the semiconductor wafer 7100. Each of the circuit regions 7102 is provided with a semiconductor device of one embodiment of the present invention.

Figure 11D:
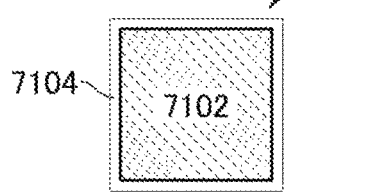
FIG. 11D is an enlarged view of a chip.

The circuit regions 7102 are each surrounded by a separation region 7104. Separation lines (also referred to as "dicing lines") 7106 are set at a position overlapping with the separation regions 7104. In the dicing step ST72, the semiconductor wafer 7100 is cut along the separation lines 7106, whereby chips 7110 including the circuit regions 7102 are cut out from the semiconductor wafer 7100. FIG. 11D is an enlarged view of the chip 7110.

A conductive layer or a semiconductor layer may be provided in the separation regions 7104. Providing a conductive layer or a semiconductor layer in the separation regions 7104 relieves ESD that might be caused in the dicing step, preventing a decrease in the yield due to the dicing step. A dicing step is generally performed while pure water whose specific resistance is decreased by dissolution of a carbonic acid gas or the like is supplied to a cut portion, in order to cool down a substrate, remove swarf, and prevent electrification, for example. Providing a conductive layer or a semiconductor layer in the separation regions 7104 allows a reduction in the usage of the pure water. Therefore, the cost of manufacturing semiconductor devices can be reduced. Thus, semiconductor devices can be manufactured with improved productivity.

After Step ST72, the divided chips are separately picked up, placed on a lead frame, and bonded thereto in a die bonding step (Step ST73). In the die bonding step, the chip may be bonded to the lead frame by an appropriate method depending on the product, for example, with a resin or a tape. As the bonding method, a method suitable for the product may be selected; for example, the chips and the lead frame may be bonded with a resin or tape. In the die bonding step, the chip may be mounted on an interposer and bonded thereto. In a wire bonding step, a lead of the lead frame and an electrode on the chip are electrically connected to each other with a metal wire (Step ST74). A silver line or a gold line can be used as the metal fine line. The wire bonding may be either ball bonding or wedge bonding.

A wire-bonded chip is subjected to a molding step of sealing the chip with an epoxy resin or the like (Step ST75). With the molding step, the inside of the electronic component is filled with a resin, thereby reducing damage to the circuit portion and the wire embedded in the component caused by external mechanical force as well as reducing deterioration of characteristics due to moisture or dust. The lead of the lead frame is plated. After that, the lead is cut and processed (Step ST76). With the plating process, corrosion of the lead can be prevented, and soldering for mounting the electronic component on a printed circuit board in a later step can be performed with higher reliability. Next, printing process (marking) is performed on a surface of the package (Step ST77). After a testing step (Step ST78), the electronic component is completed (Step ST79). An electronic component including the semiconductor device described in the above embodiment can achieve low power consumption and a small size.

Figure 11E:
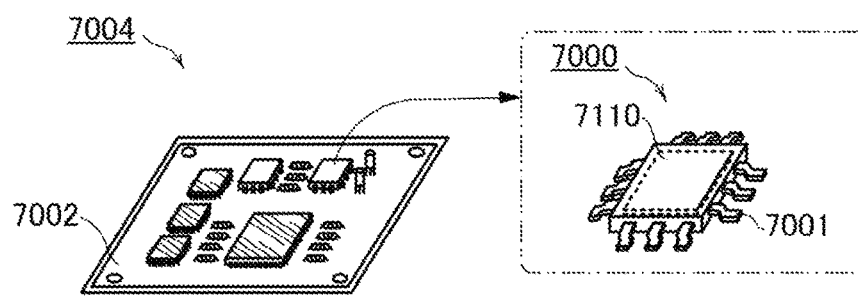
FIG. 11E is a schematic perspective view illustrating a structure example of the electronic component.

FIG. 11E is a schematic perspective view of the completed electronic component. FIG. 11E illustrates a schematic perspective view of a quad flat package (QFP) as an example of the electronic component. As illustrated in FIG. 11E, an electronic component 7000 includes a lead 7001 and a chip 7110.

The electronic component 7000 is mounted on a printed board 7002, for example. A plurality of electronic components 7000 which are combined and electrically connected to each other over the printed board 7002 can be mounted on an electronic device. A completed circuit board 7004 is provided in an electronic device or the like. When an electronic device includes the electronic component 7000, the power consumption of the electronic device can be reduced. Alternatively, the electronic device can easily have a smaller size.

The electronic component 7000 can be used as an electronic component (IC chip) of electronic devices in a wide range of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy. Examples of such an electronic device include cameras (e.g., video cameras and digital still cameras), display devices, personal computers (PC), cellular phones, game machines including portable game machines, portable information terminals (e.g., smartphones and tablet information terminals), e-book readers, wearable information terminals (e.g., watch-type information terminals, head-mounted information terminals, goggle-type information terminals, glasses-type information terminals, armband-type information terminals, bracelet-type information terminals, and necklace-type information terminals), navigation systems, audio reproducing devices (e.g., car audio players and digital audio players), copiers, facsimiles, printers, multifunction printers, automated teller machines (ATM), vending machines, and consumer electronics.

Then, applications of the electronic component to an electronic appliance such as a computer, a portable information terminal (including a mobile phone, a portable game machine, an audio reproducing device, and the like), electronic paper, a television device (also referred to as a television or a television receiver), or a digital video camera are described.

Figure 12A:
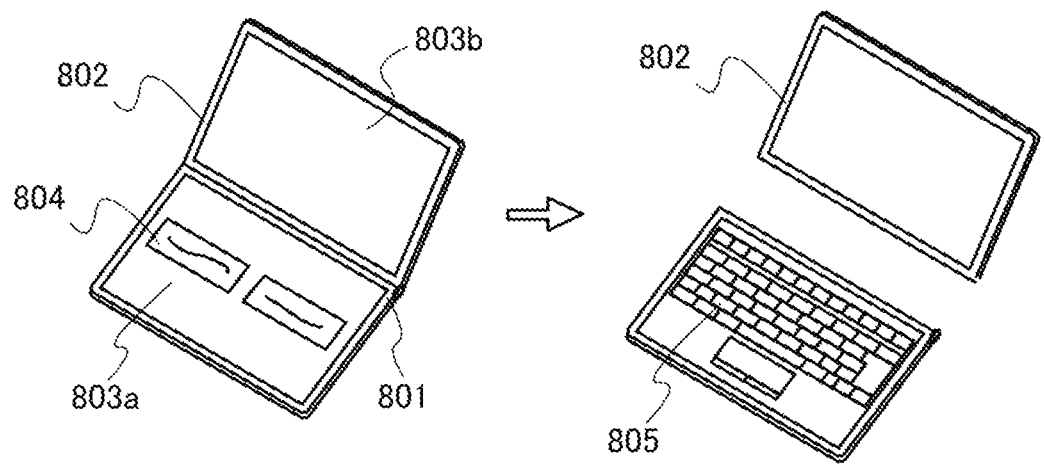
FIGS. 12A to 12E are diagrams each illustrating an electronic device.

FIG. 12A illustrates a portable information terminal that includes a housing 801, a housing 802, a first display portion 803*a*, a second display portion 803*b*, and the like. The semiconductor device described in the above embodiment is provided inside at least part of the housings 801 and 802. Thus, the portable information terminal which achieves reduction in power consumption can be obtained.

Note that the first display portion 803*a* is a touch panel, and for example, as illustrated in the left of FIG. 12A, which of "touch input" and "keyboard input" is performed can be selected by a selection button 804 displayed on the first display portion 803*a*. Because the selection buttons with a variety of sizes can be displayed, the portable information terminal can be easily used by people of any generation. For example, when "keyboard input" is selected, a keyboard 805 is displayed on the first display portion 803*a* as illustrated in the right of FIG. 12A. With the keyboard 905, letters can be input quickly by keyboard input as in the case of using a conventional information terminal, for example.

One of the first display portion 803*a* and the second display portion 803*b* can be detached from the portable information terminal as illustrated in the right of FIG. 12A. Providing the second display portion 803*b* with a touch input function makes the information terminal convenient to carry because the weight can be further reduced and to operate with one hand while the other hand supports the housing 802.

The portable information terminal illustrated in FIG. 12A can have a function of displaying various kinds of data (e.g., a still image, a moving image, and a text image), a function of displaying a calendar, a date, the time, or the like on the display portion, a function of operating or editing data displayed on the display portion, a function of controlling processing by various kinds of software (programs), and the like. Furthermore, an external connection terminal (an earphone terminal, a USB terminal, or the like), a recording medium insertion portion, and the like may be provided on the back surface or the side surface of the housing.

The portable information terminal illustrated in FIG. 12A may transmit and receive data wirelessly. Through wireless communication, desired book data or the like can be purchased and downloaded from an electronic book server.

Furthermore, the housing 802 illustrated in FIG. 12A may be equipped with an antenna, a microphone function, or a wireless communication function to be used as a mobile phone.

Figure 12B:
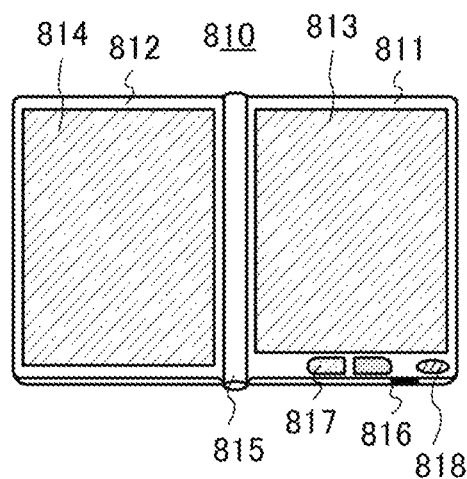

FIG. 12B illustrates an e-book reader 810 in which electronic paper is incorporated. The e-book reader includes two housings of a housing 811 and a housing 812. The housing 811 and the housing 812 are provided with a display portion 813 and a display portion 814, respectively. The housings 811 and 812 are connected by a hinge portion 815 and can be opened or closed with the hinge portion 815 as an axis. The housing 811 is provided with a power switch 816, an operation key 817, a speaker 818, and the like. At least one of the housing 811 and the housing 812 is provided with a semiconductor device including the PLD described in the above embodiment. This allows the e-book reader to have lower power consumption.

Figure 12C:
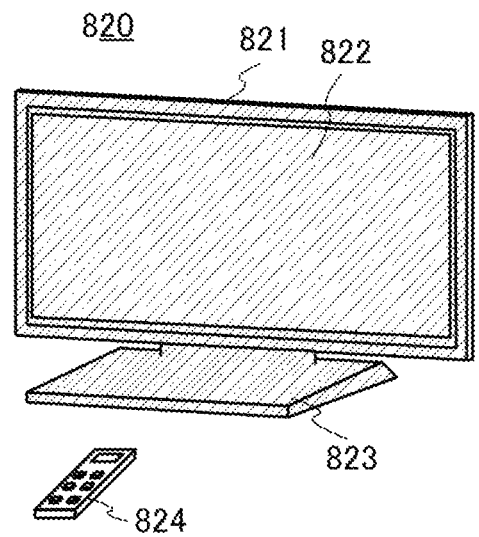

FIG. 12C illustrates a television device including a housing 821, a display portion 822, a stand 823, and the like. The television device 820 can operate with a switch of the housing 821 and a remote controller 824. A semiconductor device including the PLD described in the above embodiment is provided in the housing 821 and the remote controller 824. Thus, the television device which achieves reduction in power consumption can be obtained.

Figure 12D:
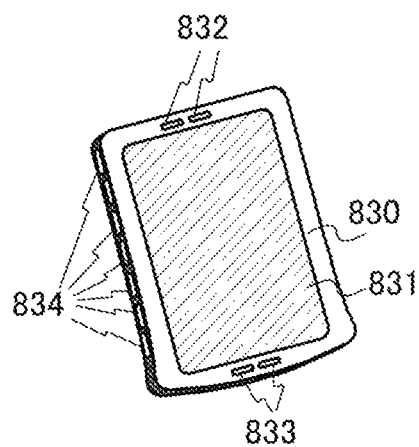

FIG. 12D illustrates a smartphone in which a main body 830 is provided with a display portion 831, a speaker 832, a microphone 833, operation keys 834, and the like. A semiconductor device including the PLD described in the above embodiment is provided in the main body 830. This allows the smartphone to be less likely to malfunction and to have lower power consumption.

Figure 12E:
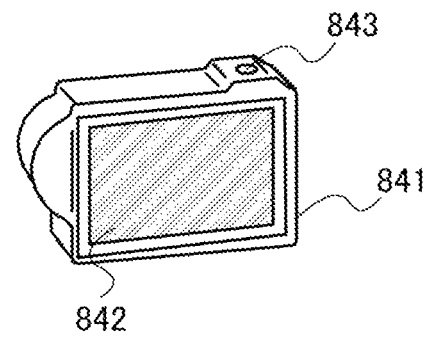

FIG. 12E illustrates a digital camera including a main body 841, a display portion 842, an operation switch 843, and the like. A semiconductor device including the PLD described in the above embodiment is provided in the main body 841. Thus, the digital camera which achieves a smaller size and higher-speed operation can be obtained.

As described above, the electronic devices described in this embodiment each include the semiconductor device according to any of the above embodiments. Thus, the electronic devices which achieve reduction in power consumption can be obtained.

<Notes on Description of this Specification and the Like>

In this specification and the like, ordinal numbers such as "first", "second", and "third" are used in order to avoid confusion among components. Thus, the terms do not limit the number or order of components. Thus, the terms do not limit the number or order of components.

In a block diagram in this specification and the like, components are functionally classified and shown by blocks that are independent of each other. However, in an actual circuit and the like, such components are sometimes hard to classify functionally, and there is a case in which one circuit is concerned with a plurality of functions or a case in which a plurality of circuits are concerned with one function. Therefore, blocks in a block diagram do not necessarily show components described in the specification, which can be explained with another term as appropriate depending on the situation.

The same elements or elements having similar functions, elements formed using the same material, elements formed at the same time, or the like in the drawings are denoted by the same reference numerals, and the description thereof is not repeated in some cases.

In this specification or the like, the terms "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, "voltage" and "potential" can be replaced with each other. The term "voltage" refers to a potential difference from a reference potential. When the reference potential is a ground potential, for example, "voltage" can be replaced with "potential." The ground potential does not necessarily mean 0 V. Potentials are relative values, and the potential applied to a wiring or the like is changed depending on the reference potential, in some cases.

In this specification and the like, a switch is conducting (on state) or not conducting (off state) to determine whether current flows therethrough or not. Alternatively, a switch has a function of selecting and changing a current path.

Examples of a switch are an electrical switch, a mechanical switch, and the like. That is, any element can be used as a switch as long as it can control current, without limitation to a certain element.

In the case of using a transistor as a switch, an "on state" of the transistor refers to a state in which a source and a drain of the transistor are electrically short-circuited. Furthermore, an "off state" of the transistor refers to a state in which the source and the drain of the transistor are electrically disconnected. In the case where a transistor operates just as a switch, the polarity (conductivity type) of the transistor is not particularly limited to a certain type.

In this specification and the like, when it is described that "A and B are connected to each other", the case where A and B are electrically connected to each other is included in addition to the case where A and B are directly connected to each other. Here, the expression "A and B are electrically connected" means the case where electric signals can be transmitted and received between A and B when an object having any electric action exists between A and B.

REFERENCE NUMERALS

10: semiconductor device, 10A: semiconductor device, 10B: semiconductor device, 10C: application processor, 10D: semiconductor device, 10E: application processor, 20: MPU, 30: I/F, 30A: I/F, 30B: I/F, 30C: display I/F, 30D: memory I/F, 32: register, 33: flip-flop, 34: memory circuit, 35: flip-flop, 36: memory circuit, 37: backup circuit, 38: switch, 40: functional device, 40A: functional device, 40B: functional device, 41: display device, 42: display controller, 43: display portion, 44: pixel, 45: DRAM, 50: system bus, 63: switch, 64: switch, 65: inverter circuit, 66: inverter circuit, 67: inverter circuit, 68: inverter circuit, 69: transistor, 70: transistor, 71: transistor, 72: capacitor, 73: transistor, 74: transistor, 75: transistor, 76: capacitor, 77: switch, 78: switch, 79: inverter circuit, 85: inverter circuit, 86: inverter circuit, 90: memory cell array, 91: word line driver circuit, 92: bit line driver circuit, MC: memory cell, MC_A: memory cell, MC_B: memory cell, MC_C: memory cell, MC_D: memory cell, MC_E: memory cell, WL: word line, BL: bit line, SL: source line, WWL: write word line, RWL: read word line, OS1: transistor, 93: capacitor, M1: transistor, M2: transistor, SN: charge retention node, S11: step, S12: step, S13: step, S14: step, S15: step, S16: step, 21: power controller, 22: SRAM, 23: GPU, 24: FPGA, 25: frame memory, 7000: electronic component, 7001: lead, 7002: printed circuit, 7004: circuit board, 7100: semiconductor wafer, 7102: circuit region, 7104: separation region, 7106: separation line, 7110: chip, 801: housing, 802: housing, 803a: display portion, 803b: display portion, 804: selection button, 805: keyboard, 810: e-book reader, 811: housing, 812: housing, 813: display portion, 814: display portion, 815: axis, 816: power source, 817: operation key, 818: speaker, 820: television set, 821: housing, 822: display portion, 823: stand, 824: remote controller, 830: main body, 831: display portion, 832: speaker, 833: microphone, 834: operation button, 841: main body, 842: display portion, and 843: operation switch.

This application is based on Japanese Patent Application serial No. 2016-081765 filed with Japan Patent Office on Apr. 15, 2016, the entire contents of which are hereby incorporated by reference.

The invention claimed is:

1. A semiconductor device comprising:
   a processor; and
   an interface circuit comprising a register for storing setting information,
   wherein the interface circuit is configured to transmit signals input and output between the processor and a functional device,
   wherein the register comprises a first memory circuit capable of storing the setting information when power supply voltage is supplied, and a second memory circuit capable of storing the setting information when supply of the power supply voltage is stopped,
   wherein the interface circuit is configured to change a state between a first state in which the setting information is stored in the first memory circuit, a second state in which the interface circuit operates on the basis of the setting information stored in the first memory circuit, a third state in which the setting information stored in the first memory circuit is stored in the second memory circuit and the supply of the power supply voltage is stopped, and a fourth state in which the supply of the power supply voltage is restarted and the setting information stored in the second memory circuit is stored in the first memory circuit,
   wherein the interface circuit is configured to change the state between the second state, the third state, and the fourth state on the basis of a state of the functional device, wherein the second memory circuit comprises a first transistor, a second transistor, a third transistor, a fourth transistor, a fifth transistor and sixth transistor, wherein the first transistor comprises an oxide semiconductor in a semiconductor layer serving as a channel formation region, wherein one of a source and a drain of the first transistor is electrically connected to a gate of the second transistor, wherein one of a source and a drain of the second transistor is electrically connected to one of a source and a drain of the third transistor, wherein one of a source and a drain of the fourth transistor is electrically connected to a gate of the fifth transistor, wherein one of a source and a drain of the fifth transistor is electrically connected to one of a source and a drain of the sixth transistor, wherein the other of the source and the drain of the second transistor is electrically connected to the other of a source and a drain of the fifth transistor, wherein the other of the source and the drain of the third transistor is directly connected to the other of the source and the drain of the fourth transistor, wherein the other of the source and the drain of the sixth transistor is directly connected to the other of the source and the drain of the first transistor, wherein a gate of the first transistor is electrically connected to a gate of the fourth transistor, wherein a gate of the third transistor is electrically connected to a gate of the sixth transistor, and wherein the first transistor is configured to retain charge of the gate of the second transistor when turned off.

2. An electronic component comprising:

the semiconductor device according to claim 1; and a lead electrically connected to the semiconductor device.

3. An electronic device comprising:

the electronic component according to claim 2; and at least one of a display device, a touch panel, a microphone, a speaker, an operation key, and a housing.

* * * * *